United States Patent
Smith et al.

(10) Patent No.: US 10,763,013 B2
(45) Date of Patent: Sep. 1, 2020

(54) REDUCING LOSSES IN SUPERCONDUCTING CABLES

(71) Applicant: Microsoft Technology Licensing, LLC, Redmond, WA (US)

(72) Inventors: Burton J. Smith, Redmond, WA (US); David B. Tuckerman, Lafayette, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/416,002

(22) Filed: May 17, 2019

(65) Prior Publication Data

US 2019/0341174 A1    Nov. 7, 2019

Related U.S. Application Data

(62) Division of application No. 15/972,675, filed on May 7, 2018, now Pat. No. 10,453,592.

(51) Int. Cl.
*H01B 12/16* (2006.01)
*H03K 19/195* (2006.01)
(Continued)

(52) U.S. Cl.
CPC .......... *H01B 12/16* (2013.01); *H02G 3/0462* (2013.01); *H03K 19/195* (2013.01); *H01B 3/306* (2013.01); *H01P 3/08* (2013.01); *H05K 7/20336* (2013.01)

(58) Field of Classification Search
CPC ...... H01B 12/16; H01B 3/306; H02G 3/0462; H03K 19/195; H01P 3/08; H05K 7/20336
(Continued)

(56) References Cited

U.S. PATENT DOCUMENTS

| | | | | |
|---|---|---|---|---|
| 3,950,606 A | * | 4/1976 | Schmidt | H01B 7/29 174/15.5 |
| 4,872,321 A | * | 10/1989 | Buchanan | F25B 9/00 62/51.1 |
| 7,614,243 B2 | * | 11/2009 | Masuda | H01B 12/16 62/113 |
| 2009/0197769 A1 | * | 8/2009 | Hirose | H01R 4/68 505/163 |

(Continued)

FOREIGN PATENT DOCUMENTS

WO    2018191041 A1    10/2018

OTHER PUBLICATIONS

Jin, et al., "HTS Power Devices and Systems: Principles, Characteristics, Performance, and Efficiency", Published in IEEE Transactions on Applied Superconductivity vol. 26, Issue 7, Oct. 2016, 26 Pages.

(Continued)

*Primary Examiner* — Timothy J Thompson
*Assistant Examiner* — Michael F McAllister
(74) *Attorney, Agent, or Firm* — Holzer Patel Drennan

(57) ABSTRACT

Methods and apparatus are disclosed for cooling superconducting signal lines disposed on an interconnect such as a flexible cable or a rigid substrate. The superconducting signal lines are cooled to a cryogenic temperature lower than the temperature at which at least some superconducting logic devices coupled to the interconnect are operated. In some examples, an airtight conduit, heat pipe, or thermally conduct of strap provided to cool the superconducting interconnect. In one example of the disclosed technology, a system includes at least two sets of superconducting logic devices, cooling apparatus adapted to cool the logic devices to a first operating temperature, and interconnect coupling the superconducting logic devices, and a cooling apparatus in thermal communication with the interconnect. The apparatus is adapted to cool superconducting signal lines on the interconnect to a lower operating temperature than the first (Continued)

operating temperature at which the superconducting logic devices operate.

17 Claims, 10 Drawing Sheets

(51) Int. Cl.
*H01P 3/08* (2006.01)
*H02G 3/04* (2006.01)
*H05K 7/20* (2006.01)
*H01B 3/30* (2006.01)

(58) Field of Classification Search
USPC ........................................................ 174/15.5
See application file for complete search history.

(56) References Cited

U.S. PATENT DOCUMENTS

2010/0087322 A1* 4/2010 Yuan ..................... H02G 15/34
  505/163
2014/0027141 A1* 1/2014 Yagi ......................... H01R 4/68
  174/15.5

OTHER PUBLICATIONS

"International Search Report and Written Opinion Issued in PCT Application No. PCT/US19/029521", dated Aug. 8, 2019, 12 Pages.
Rummel, et al., "The Superconducting Magnet System of the Stellarator Wendelstein 7-X", Published in IEEE Transactions on Plasma Science, vol. 40, Issue 3, Mar. 2012, pp. 769-776.

* cited by examiner

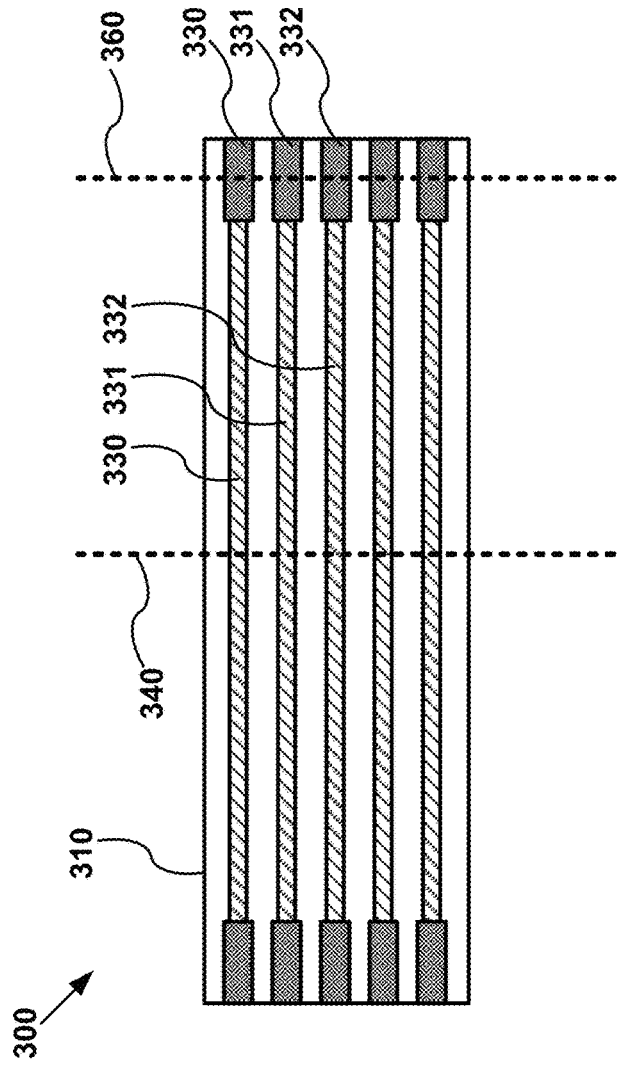
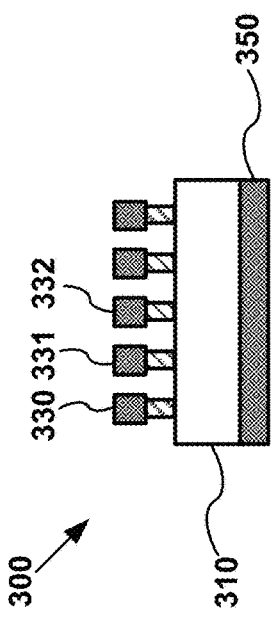
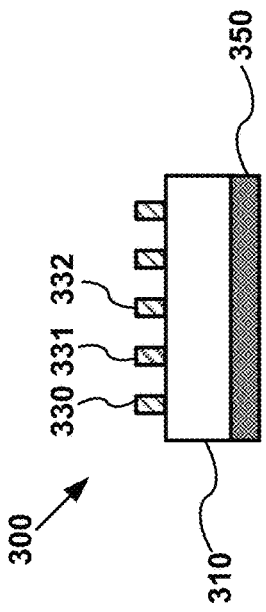

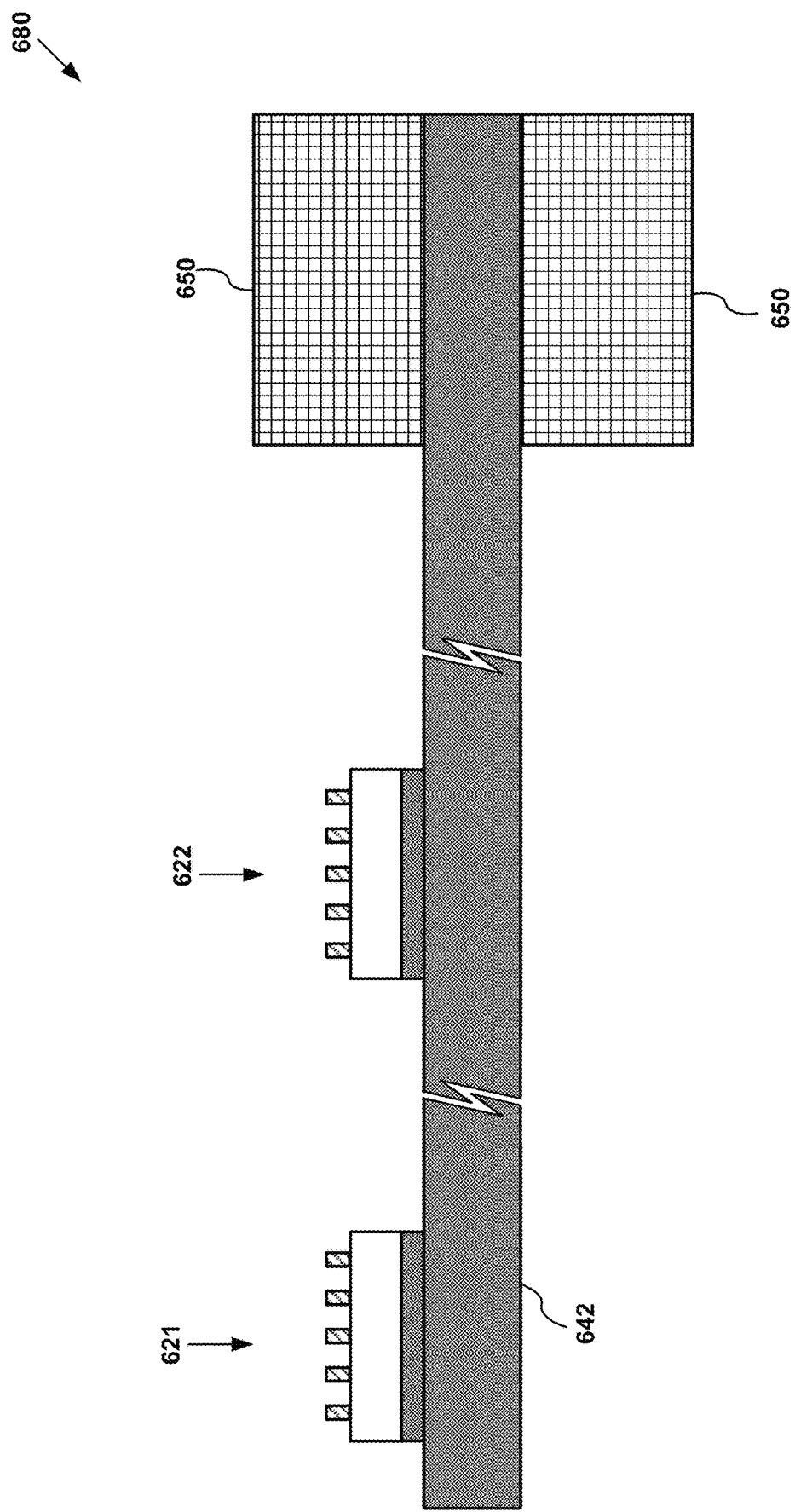

REDUCING LOSSES IN SUPERCONDUCTING CABLES

CROSS-REFERENCE TO RELATED APPLICATIONS

This is a divisional of U.S. patent application Ser. No. 15/972,675, filed May 7, 2018, which application is incorporated herein by reference in its entirety.

BACKGROUND

Traditional semiconductor based integrated circuit technology, such as technology based on silicon or gallium arsenide device technology, is reaching its physical limits in terms of device size, switching frequency, and power consumption. Moreover, integrated circuits deployed in data centers are consuming increasing amounts of power. This includes power consumed by leakage current when semiconductor devices are not switching. There is substantial interest in building quantum computers that can perform certain types of useful computations (e.g., quantum chemistry) faster and more cost-effectively than any existing digital computer technology.

One approach to addressing the limits of traditional semiconductor technology is the use of superconducting logic based devices. Such devices are typically cooled to cryogenic temperatures in order to function in a superconducting state. Refrigeration devices to provide this cooling to superconducting logic devices are expensive and consume significant amounts of energy. Thus, there remains ample opportunity for improvement computers built with superconducting logic based devices including interconnects used to transmit signals between sets of superconducting logic based devices.

SUMMARY

Apparatus and methods are disclosed to cool superconducting cables and interconnect to low temperatures. In some examples, flexible, multiconductor microstrip or stripline ribbon cables are cooled using low temperature gas or liquid (e.g., helium) enclosed in a conduit or other containing apparatus. In some examples, a heat pipe or thermally-conductive strap is provided in thermal communication with cables or interconnect in order to provide cooling. Superconducting interconnect coupling two or more sets of logic devices can be cooled to a temperature lower than the logic devices, reducing attenuation of signals carried by the interconnect, but without using additional energy to provide more extensive cooling to refrigerate the logic devices.

Superconducting signal lines disposed on an interconnect such as a flexible cable or rigid substrate can be cooled to a cryogenic temperature lower than the temperature at which at least some superconducting logic devices coupled to the interconnect are operated. In some examples, an airtight conduit, a heat pipe, or a thermally conductive strap is provided to cool the superconducting interconnect. In one example of a disclosed technology, a system includes at least two sets of superconducting logic devices, cooling apparatus adapted to cool the logic devices to a first operating temperature, and interconnect coupling the superconducting logic devices. A cooling apparatus is provided in thermal communication with the interconnect. The apparatus is adapted to cool superconducting signal lines on the interconnect to a lower operating temperature than the first operating temperature at which the superconducting logic devices operate. By only cooling the superconducting signal lines to a lower temperature than the coupled logic devices, significant energy savings can be realized for the system as a whole. The temperature at which the signal lines are cooled can be selected based on the materials used, distance constraints, operating constraints such as frequency, and energy consumption.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. The foregoing and other objects, features, and advantages of the disclosed technology will become more apparent from the following detailed description, which proceeds with reference to the accompanying figures.

BRIEF DESCRIPTION OF THE DRAWINGS

FIGS. 3A-3C are diagrams illustrating an example interconnect that can be cooled using certain disclosed conduits or heat pipes.

FIGS. 6A and 6B illustrate an example of a multi-branch interconnect cooled with thermally-conductive straps, as can be implemented in certain examples of the disclosed technology.

DETAILED DESCRIPTION

I. General Considerations

Figure 1:
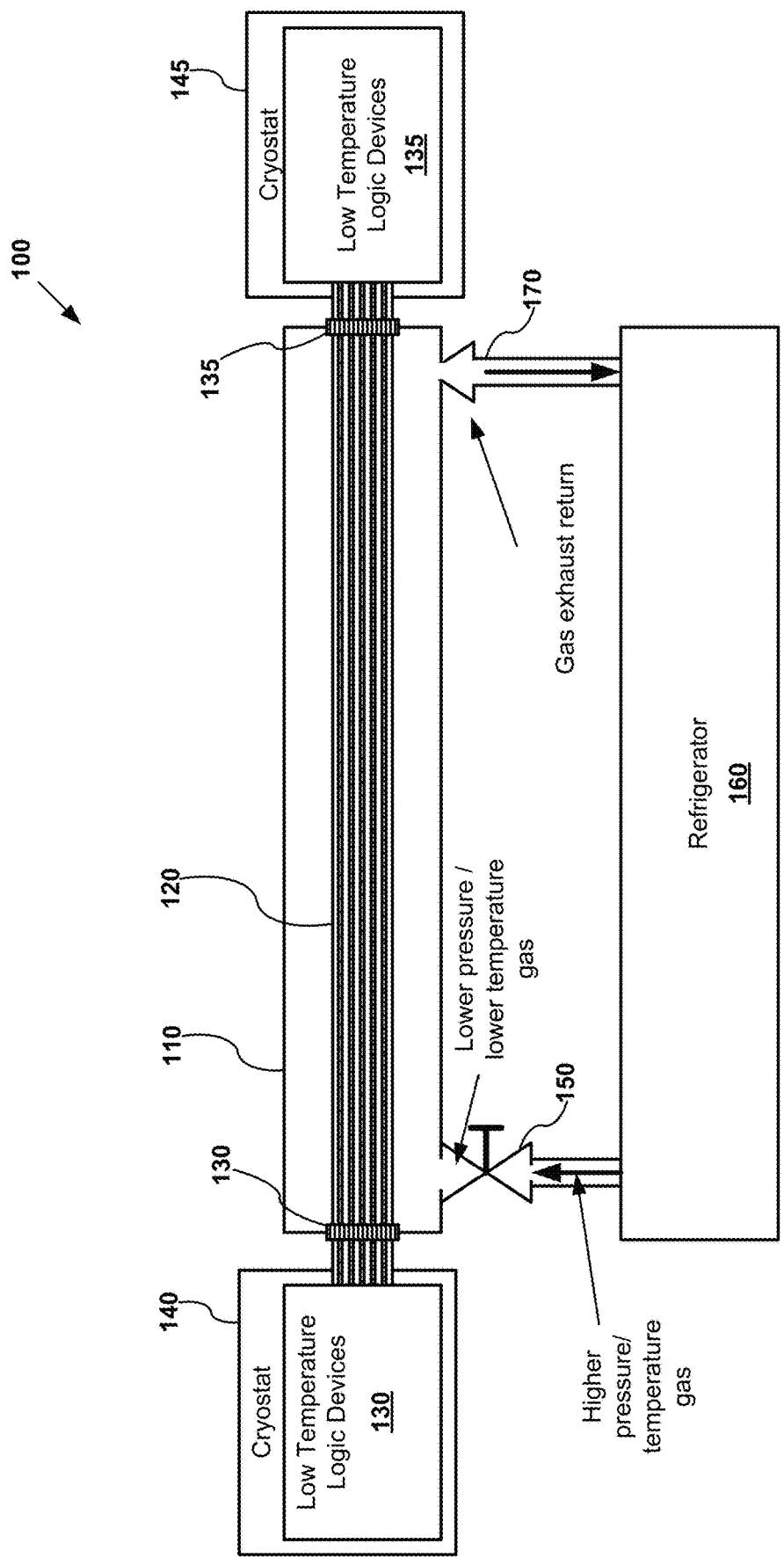
FIG. 1 is a block diagram depicting an example system that can be used to cool superconducting interconnect, as can be implemented in certain examples of the disclosed technology.

Disclosed herein are representative embodiments of methods, apparatus, and systems for the design, manufacture, and assembly of substrates carrying conductor and/or superconductor materials using connectors that form mechanical and/or electrical connections between such substrates. This disclosure is set forth in the context of representative embodiments that are not intended to be limiting in any way.

As used in this application the singular forms "a," "an," and "the" include the plural forms unless the context clearly dictates otherwise. Additionally, the term "includes" means "comprises." Further, the term "coupled" encompasses mechanical, electrical, magnetic, optical, as well as other practical ways of coupling or linking items together, and does not exclude the presence of intermediate elements between the coupled items. Furthermore, as used herein, the term "and/or" means any one item or combination of items in the phrase.

The systems, methods, and apparatus described herein should not be construed as being limiting in any way. Instead, this disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed things and methods require that any one or more specific advantages be present or problems be solved. Furthermore, any features or aspects of the disclosed embodiments can be used in various combinations and subcombinations with one another.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed things and methods can be used in conjunction with other things and methods. Additionally, the description sometimes uses terms like "produce," "generate," "fabricate," "receive," "cool," "provide," and "adapt" to describe the disclosed methods. These terms are high-level descriptions of the actual operations that are performed. The actual operations that correspond to these terms will vary depending on the particular implementation and are readily discernible by one of ordinary skill in the art having the benefit of the present disclosure.

As used in this application and in the claims, the singular forms "a," "an," and "the" include the plural forms unless the context clearly dictates otherwise. Additionally, the term "includes" means "comprises." Moreover, unless the context dictates otherwise, the term "coupled" means mechanically, electrically, or electromagnetically connected or linked and includes both direct connections or direct links and indirect connections or indirect links through one or more intermediate elements not affecting the intended operation of the described system.

Additionally, certain terms may be used such as "up," "down," "upper," "lower," and the like. These terms are used, where applicable, to provide some clarity of description when dealing with relative relationships. But, these terms are not intended to imply absolute relationships, positions, and/or orientations.

References to "superconducting" components, such as superconducting interconnect, striplines, microstrips, signal lines, or logic devices, refers to components fabricated from superconductor materials that can be situated to operate in a superconducting mode when at or below a material's respective critical temperature. However, referenced superconducting components may not necessarily be in a superconducting state when certain acts described herein are performed. For example, coupling a superconducting cable to a set of superconducting logic devices refers to forming such a coupling, which may then be placed in a superconducting state at a later point in time by cooling the logic devices and interconnect below their respective critical temperatures.

Theories of operation, scientific principles, or other theoretical descriptions presented herein in reference to the apparatus or methods of this disclosure have been provided for the purposes of better understanding and are not intended to be limiting in scope. The apparatus and methods in the appended claims are not limited to those apparatus and methods that function in the manner described by such theories of operation.

II. Introduction to the Disclosed Technology

High frequency signals are moderately attenuated despite their being transmitted over superconducting cables configured as stripline, microstrip, or coaxial transmission lines. The reason is that a small but significant population of normal (unpaired) electrons within the superconductor are accelerated in the usual way by the time-varying electromagnetic fields generated by the supercurrents. Unlike supercurrents, however, the normal currents dissipate power in the surface resistance of the wires. This can distort the transmitted signal by reducing its high frequency content. Thus, while a superconductor line may act as a perfect superconductor at DC, at higher frequencies (e.g., GHz range), significant losses may be observed due to the presence of normal electrons.

The higher the frequency, the more pronounced is this effect. At a given frequency, the attenuation coefficient a describes how much the signal is attenuated as it travels along the line. For example, an attenuation coefficient of $\alpha=10^{-3}$ nepers/cm means that the signal amplitude is reduced by 0.1% per centimeter, or roughly 10% per meter as it travels. The attenuation coefficient is a combination of both dielectric loss and superconductor loss. It is often the case that the attenuation due to dielectric loss increases linearly with frequency, whereas the attenuation due to superconductor loss increases as the square of frequency. Therefore, the superconductor loss becomes the largest source of attenuation at high frequencies.

Lowering the temperature of the cable can reduce this attenuation. Typically both dielectric losses and superconductor losses get smaller as temperature is reduced towards absolute zero. The superconductor losses are particularly sensitive to temperature. At higher temperatures, there are more free (non-Cooper pair) electrons to contribute to loss.

Bardeen-Cooper-Schrieffer (BCS) theory tells us that the density ratio of normal electrons to Cooper pairs has an exponential dependence on temperature. For niobium (Nb, element 41) that is colder than approximately 4.65 K (½ of its critical temperature which is normally 9.3 K), the resulting surface resistance can be approximated as proportional to $f^2 \times \exp((-17.67/T)/T)$, where T is the absolute temperature of the cable and f is the signal frequency. For example, the surface resistance of Nb would be reduced by a factor of approximately 49× simply by reducing its temperature from 4.2 K (the temperature of saturated liquid helium (He) at one atmosphere pressure) down to 2 K. The portion of the attenuation coefficient that is due to superconductor losses will therefore be reduced by approximately 49× when the cable is cooled from 4.2 K to 2.0 K.

The dielectric loss contribution to the attenuation coefficient is not as sensitive to temperature. As the cable is cooled down, eventually the superconductor losses will become negligible and the attenuation coefficient consists primarily of dielectric loss ("loss tangent"). The loss tangents of interconnect with polyimide cables, over frequencies from 1 to 20 GHz, are remarkably low at deep cryogenic temperatures—typically 100 times smaller than corresponding room temperature values. This enables fairly long-distance (meter-scale) transmission of microwave (~10 GHz) range signals without excessive attenuation, and also permits usefully high RF power levels to be transmitted without creating excessive dielectric heating. Superconducting transmission lines can perform well with trace widths of a few microns. For typical nominal impedances, the dielectric thicknesses will also be a few microns.

Compared with conventional cables using conductors, superconducting flexible impedance-controlled cables such as microstrip, stripline, or coplanar waveguides permit the transmission of high-speed electrical signals over long distances with minimal loss. In addition, their physical cross section can be very small, so that large numbers of signals can be transmitted in a single compact ribbon cable. However, the performance advantages may be lost if the cable temperature approaches or exceeds $T_c$, such as occurs when connecting from the cryogenic environment to higher temperature electronics.

Apparatus and methods are disclosed to cool superconductor cables and interconnect to low temperatures. In some examples, flexible multiconductor microstrip or stripline ribbon cables are cooled using low temperature helium gas enclosed in a pipe. For example, a Joule-Thomson valve can be used to expand helium gas received at 4.2K and one atmosphere (14.70 pounds per square inch (psi) or $1.01325 \times 10^5$ Pascal (Pa)) by a factor of 32, to approximately 0.034 atmosphere (0.5 psi/$3.447 \times 10^3$ Pa) thereby reducing the temperature of the gas to 2K. Larger pressure drops will generate lower temperatures to enable longer cables or higher signaling rates.

In some examples, helium gas from a single source at 2K can be passed over multiple ribbon cables in the same pipe. The low losses imply that the helium gas is scarcely heated by multiple cables. A network of cables that connects multiple endpoints can be cooled by enclosing the network in a network of pipes that spans the endpoints. Each endpoint can have its own Joule-Thomson expander valve to supply helium to the pipe network. Multiple exhaust points of sufficient diameter to generate a significant pressure gradient can be located centrally in the pipe network and connected to a helium liquefier for recompression and recirculation.

Methods, apparatus, and systems for design and fabrication of various configurations of substrates, including conducting or superconducting flexible cables using microstrip geometries are disclosed. In some examples, a superconducting flexible cable has a number of signal conductors disposed on one side, and a power or ground plane disposed on another (e.g., an opposite or obverse side). In some examples, typical signal lines disposed on a flexible cable surface are 50 microns wide. In some examples, the signal line width may be varied between 10 to 100 microns. In some examples, signal lines comprising niobium, including selected niobium alloys, are intended to operate at deep cryogenic temperatures (e.g., about and below 4K). High-density connections can be made between a pair of such flexible cables. In some examples, the two cables to be connected are precisely aligned end-to-end with a small gap between the two ends. In other examples, the cable may abut or overlap slightly. A "bridging connector" containing an array of short electrical connections is clamped above the joint area, creating lap-joint electrical contacts that provide electrical continuity between the respective signal lines of the two flex cables. Similarly, another bridging connector is clamped below the joint area, providing electrical contact between the power or ground planes of the two flex cables. In such examples, precision micro-fabricated pillars engage with micro-fabricated holes to provide mechanical self-alignment of the bridging connectors and the cables. In some examples, simple thin-film conductors are used on the bridging connectors. In some examples, gold contacts may be used. For example, gold plating atop the superconductor can be made sufficiently thin, (e.g., 20 nm or less), such that the gold layer can become superconducting, owing to the proximity effect. In other examples, thicker layers of conductor (e.g., copper, aluminum, silver, gold, or titanium) are used, but some resistance is created in the line.

III. Example Interconnect and Conduit

FIG. 1 is a block diagram 100 depicting an example system that can be used to cool superconducting interconnect in certain examples of the disclosed technology. In the example system, a sealable conduit is adapted to enclose at least a portion of a superconducting interconnect. The conduit can be further adapted to be coupled to one or more sets of superconducting logic devices. The conduit can be further adapted to receive liquid or gas coolant to chill the superconducting interconnect to a lower temperature than superconducting logic devices coupled to the interconnect.

As shown in FIG. 1, a conduit 110 encloses a portion of a superconducting interconnect cable 120. The superconducting interconnect cable is situated to carry signals between a first set of logic devices 130 and a second set of logic devices 135. The first and second set of logic devices include superconducting devices can operate in a cryogenic thermal environment. For example, the devices can include traditional CMOS-based or other types of the devices that can operate at temperatures of approximately 70 K or below. The logic devices may also include superconducting logic based devices that operate at even lower temperatures, for example at 4 K or below, or 20 mK or below. In some examples, the superconducting logic devices may include circuits based on Josephson Junction based devices. The superconducting logic devices can include circuits having one or more Josephson junction devices. Typical Joseph injunctions include a thin insulator or conductor sandwiched between two superconductor materials. The thin layer provided is thin enough to allow for electrical current to pass from one portion of the superconductor material to the other portion of superconductor material on the other side of the thin layer. For example, the superconductor material can include niobium and an insulator provided by a thin (e.g., 5 to 20 angstrom) layer of aluminum oxide. As an exemplary superconductor, niobium (Nb) has a critical temperature ($T_c$) of approximately 9.2 Kelvin. At temperatures below $T_c$, niobium is superconductive; however, at temperatures above $T_c$, it behaves as a normal metal with electrical resistance. In a superconductor-insulator-superconductor (SIS) type Josephson junction, the superconductor layers can be made from niobium and the insulator layer may be formed from aluminum oxide. A supercurrent passes through the Joseph injunction as a function of the sign of the phase difference between the two junction electrodes.

The dimensions, including layer thickness, aspect ratios, pitches, lengths, and widths, can be selected according to desired circuit performance. In some examples, interconnects as long as one meter or more can be constructed. Desirably, the interconnect temperature is selected such that signal attenuation is less than 10% over the length of the cable. Further, because the logic devices can be maintained at a higher temperature than the interconnect, substantial energy savings can be realized by limiting the lower cooling to the interconnect portions of the system.

The superconductor logic devices are maintained at operating temperature by enclosing the devices within one or more cryostats 140 and 145. The cryostats provide cooling to the superconductor logic devices and have at least one terminal or opening allowing the superconducting interconnect cable 120 to be received by the conduit 110. The superconducting interconnect cable 120 includes at least one signal line comprising superconducting material disposed over an insulator. For example, a plurality of striplines or microstrips formed from a super conduct or material can be disposed over a rigid or flexible insulator. Further examples detailing construction and use of suitable superconducting interconnect cables, such as the cable 120, are described with reference to the examples below.

The conduit 110 is configured to enclose at least a portion of the interconnect and has an airtight seal. Suitable connections are provided to interconnect cable from the logic devices to the terminal. The conduit is airtight and may be hermetically sealed. The sealing is provided in part by hermetically sealing clamps 130 and 135 which allow the interconnect 120 to extend outside of the conduit while maintaining an airtight seal. The conduit includes at least one Joule-Thomson valve 150. The Joule-Thomson valve is coupled to the conduit 110 and adapted to accept a gas provided at a first temperature and a first pressure. The Joule-Thomson valve is further adapted to provide the gas coolant to an interior portion of the conduit 110 at a lower pressure than the first pressure and at a second temperature lower than the first temperature. The Joule-Thomson valve 150 coupled to the conduit is adapted to provide a gas coolant to an interior portion of the conduit. The Joule-Thomson valve 150 is configured to accept higher-pressure gaseous helium and provide the helium into the conduit at a lower temperature and pressure. For example, the Joule-Thomson valve can be configured to accept helium at 4.2K at one atmosphere pressure and emit lower pressure helium at 2K at 0.5 psi into the conduit 110. The cooled gaseous helium is provided to the Joule-Thomson valve by a refrigerator 160. For example, the refrigerator 160 can be a dilution refrigerator, such as a Leiden Cryogenics CF450 3He/4He dilution refrigerator. However, as will be readily understood to one of ordinary skill in the art having the benefit of the present disclosure, any suitable cooling apparatus can be used.

The conduit 110 further includes at least one exhaust port 170 that is adapted to receive the gas coolant from the interior portion of the conduit. The exhaust port 170 is coupled to receive helium gas from the conduit 110 and return it to the refrigerator 160 to be recompressed, cooled, and recycled back to the conduit. In some examples, the same refrigerator is also used to provide coolant to the cryostats containing the superconductor logic devices. In other examples, a different unit provides cooling to the superconductor logic devices.

IV. Example Conduit and Interconnect Having Multiple Connections

Figure 2:
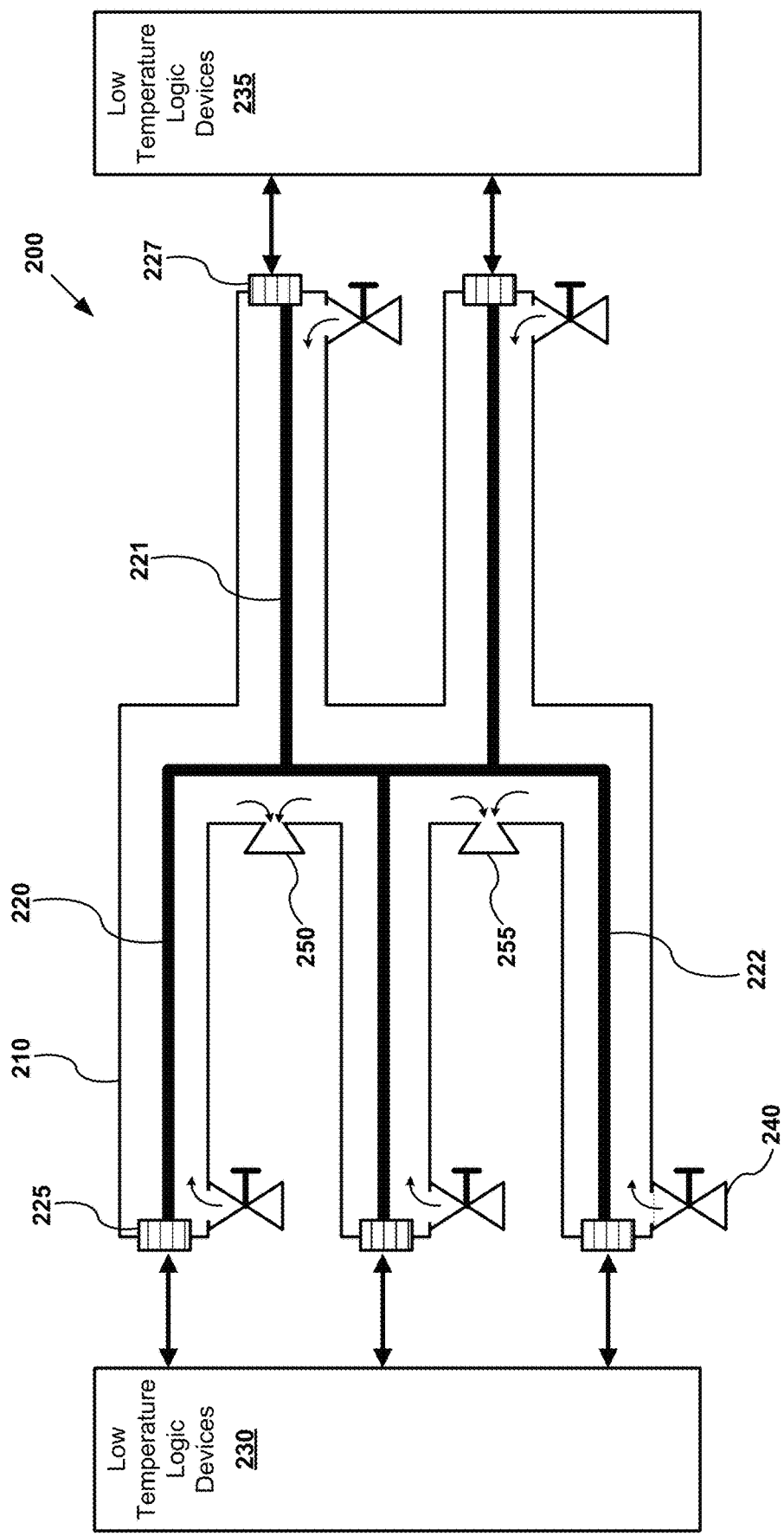
FIG. 2 is a block diagram illustrating an example system including conduit and interconnect having multiple connections, as can be implemented in certain examples of the disclosed technology.

FIG. 2 is a block diagram 200 illustrating an example system comprising an example conduit and interconnect having multiple connections as can be employed in certain examples of the disclosed technology. The system can include one, two, or more sets of superconducting logic devices, cooling apparatus adapted to cool logic devices at or below a first operating temperature, and interconnect at least partially enclosed within a conduit and comprising superconducting signal lines. The cooling apparatus is situated in thermal communication with the interconnect and is adapted to cool the superconducting signal lines on the interconnect to a second, lower operating temperature than the first operating temperature of the sets of superconducting logic devices.

As shown in FIG. 2, a conduit 210 is airtight and encloses multiple branches of interconnect 220, 221, 222, etc. The interconnect 220 can be hermetically sealed and includes connections such as hermetically-sealing clamps 225 and 227 that connect the interconnect 220 enclosed inside the conduit to other interconnect coupled to one or more sets of low temperature logic devices, for example, 230 or 235. Each branch of the conduit 210 is coupled to a Joule-Thomson valve (e.g., Joule-Thomson valve 240) that provides coolant gas at one end of the conduit branch 210. The conduit 210 further includes a number of exhaust ports, for example, exhaust ports 250 and 255, which allow for coolant gas to exhaust from the interior of the conduit 210 so that it can be recovered and sent to a helium refrigerator. By providing helium gas to cool the interconnect 220, the Q factor is reduced for the interconnect as the temperature of the interconnect 220 inside the conduit is reduced substantially below the temperature at which the coupled low temperature logic devices operate.

V. Example Superconducting Interconnect

FIGS. 3A-3C illustrate an example interconnect 300 that can be cooled using enclosed conduits or heat pipes as discussed herein. FIG. 3A is a plan view of the interconnect which it includes a substrate 310 (which can be manufactured from polyimide-based film or other suitable material) on which has been disposed a number of superconducting striplines, for example striplines 320, 321, and 322. The striplines can be made from, for example, a 250 nanometer (nm) thick layer of niobium deposited over an optional 10 nm adhesion layer formed from titanium. In some examples, flexible superconducting cables may be fabricated using a glass substrate. An initial polyimide film (e.g., Pyralin PI-2611 or HD-4100) having a thickness of about 20 micron (μm) may be spin-coated onto the glass substrate. Using a plasma process, followed by a physical vapor deposition (PVD) process, a thin titanium film may be applied to the cured polyimide film. Next, signal lines formed from a superconductive metal layer, for example, a niobium layer may be deposited. Next, the optional titanium/niobium stack may be capped with a copper layer or other suitable conductors, such as gold or silver. For example, a 500 nm layer of copper can be used. Finally, lithography and thin-film processing techniques may be used to pattern tracks of conductors, form signals lines (e.g., microstrips, striplines, or other paths on the substrate). A polyimide layer may then be applied and cured on top of the conductors. These processes can be repeated to form a structure with multiple conductor layers. As will be readily understood to one of ordinary skill in the relevant art having the benefit of the present disclosure, the selection of layer thicknesses, widths, lengths, line pitches, and other aspects can be selected based on desired performance characteristics for the interconnect.

Any suitable superconducting material can be used for the superconducting lines, including, for example, niobium, molybdenum nitride, niobium titanium nitride, niobium-nitride, or alloys of such materials. Niobium thin films are susceptible to cracking and delamination from the underlying substrate, especially when subjected to flexing as in the case of a flexible cable. The superconducting striplines may be disposed over an intervening, optional adhesion layer disposed on the substrate, which can be made from, for example, titanium. Titanium may be used as an adhesion and transition layer for subsequently deposited metal layers. The interconnect 300 further includes contact metallization disposed over the ends of the superconducting striplines. In some examples, the contact material may be made from a superconductor, while in other examples, thin layers of materials such as copper, aluminum, silver, gold, or titanium may be used. FIG. 3B is a cross-section of the interconnect 300 taken as indicated by the dashed line 340. As shown, there are a number of striplines including striplines 320, 321, and 322 disposed over the substrate 310. The obverse side of the interconnect 300 includes a planar layer 350 disposed over the backside of the interconnect 300. The planar layer 350 may be made from a superconductor material, for example niobium or other materials discussed above, or may be made from a conductor layer, such as one of the conductors listed above. In some examples, the planar layer 350 may be configured to act as a ground plane for the interconnect 300. In some examples, the planar layer 350 may be placed in thermal conductivity with a heat pipe or thermally-conductive strap. For example, a thermally-conductive strap formed from copper can be used to conduct heat away from the planar layer to a cold plate, as discussed further below. FIG. 3C is a cross-section of the interconnect 300 taken at a section as indicated by the dashed line 360. As shown, each of the striplines has a portion of contact metallization 330, 331, and 332 disposed over the ends of the striplines. Examples of suitable materials include lead, indium, or copper.

In some examples, high temperature superconductor materials, such as yttrium barium copper oxide (YBCO) or bismuth strontium calcium copper oxide (BSCCO) may be used to provide superconducting interconnect at higher relative temperature (e.g., up to about 70K for these materials).

VI. Additional Example Interconnect

Figure 4B:
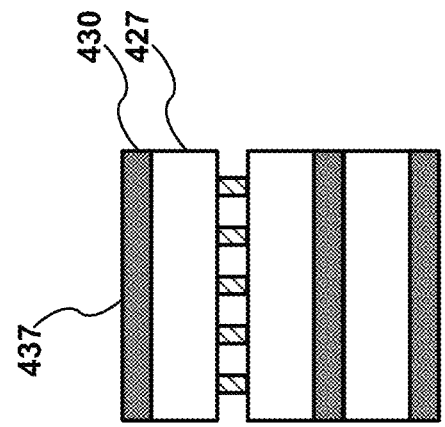
FIGS. 4A and 4B are diagrams illustrating alternate example interconnects, as can be used in certain examples of the disclosed technology.
Figure 4A:
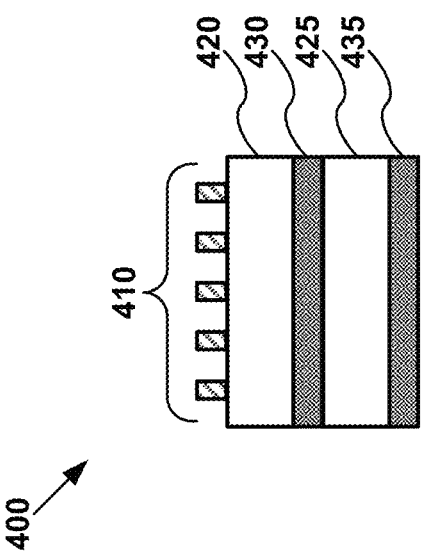

FIGS. 4A-4B depict cross-sections of alternate interconnect configurations, as can be used in certain examples of the disclosed technology. FIG. 4A illustrates an interconnect 400 having multiple superconducting striplines 410 disposed over a substrate, for example polyimide-based film 420. The interconnect can include multiple planar layers, for example planar layers 430 and 435 and substrates 425. In some examples, one of the planar layers may be made of a superconducting material, while another of the layers is made from a conductor material. In other examples, both of the planar layers are made from superconductor material or from conductor material. FIG. 4B illustrates the interconnect 400 after an additional substrate 427 having a planar layer made of superconductor or conductor material 437 on the obverse side of the insulator. It should be noted that one or more of the planar layers 430, 435, and/or 437 can be situated in thermal conductivity with a heat pipe or other cooling means. In some examples, one or more of the planar layers may be connected to a power or ground signal.

Figure 5B:
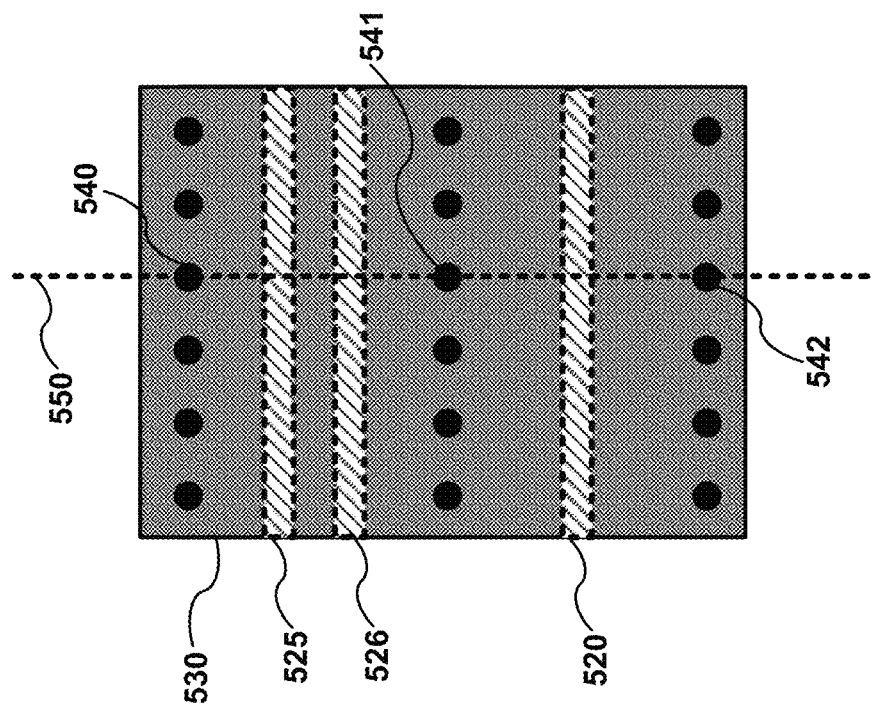
FIGS. 5A and 5B illustrate another example of a superconducting interconnect, as can be implemented in certain examples of the disclosed technology.
Figure 5A:
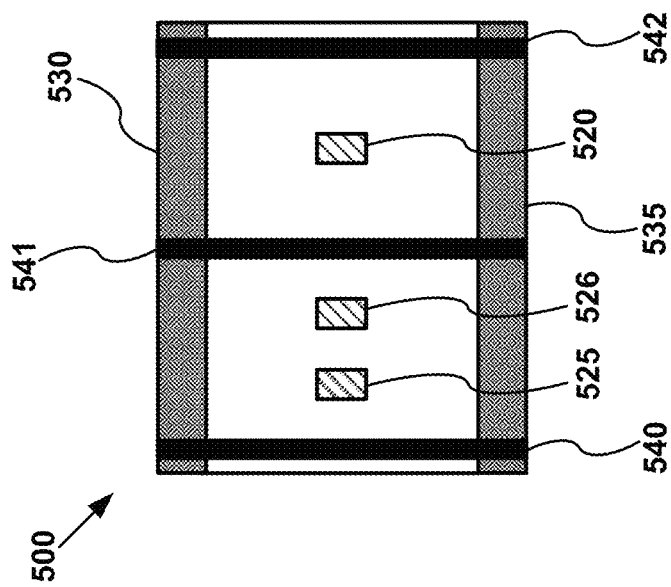

FIGS. 5A and 5B illustrate a cross-section and a plan view, respectively, of a superconducting "coaxial" interconnect 500, as can be employed in certain examples of the disclosed technology. For example, the illustrated cable is an interconnect that can be enclosed within a conduit and cooled by a coolant such as liquid helium or can be placed in thermal communication with a heat pipe or thermally-conductive strap.

As shown in the cross-section of FIG. 5A, a single superconductor signal line 520 is enclosed within an insulator, such as polyimide, Kapton, yttrium-stabilized zirconia (YSZ), Ceraflex, fluorinated ethylene propylene, Teflon, Mylar, or a ceramic material. The example cable further includes a pair 525, 526 of signal lines enclosed in another portion of the interconnect 500. The pair of signal lines can be situated to communicate a differential signal on the pair of signal lines. The interconnect 500 includes planar layers 530 and 535 situated above and below the signal lines 520, 525, and 526. The planar layers are connected by a series of shielding vias for example shielding vias 540, 541, and 542 which can provide electrical connections and mechanical rigidity to the interconnect 500 assembly.

The cross-section of FIG. 5A is indicated by a dotted line 550. As shown in the plan view of FIG. 5B, a number of additional shielding vias are provided which can act to shield electromagnetic and interference between the signal lines, for example between the signal line 520 and the differential pair 525 and 526, which are located below the planar layer 530 as indicated by the dashed lines. The vias can be manufactured from any suitable conductor, for example, including one or more of: copper, aluminum, gold, silver, or tungsten.

VII. Example Multi-Branch Interconnect and Thermally-Conductive Strap

Figure 6A:
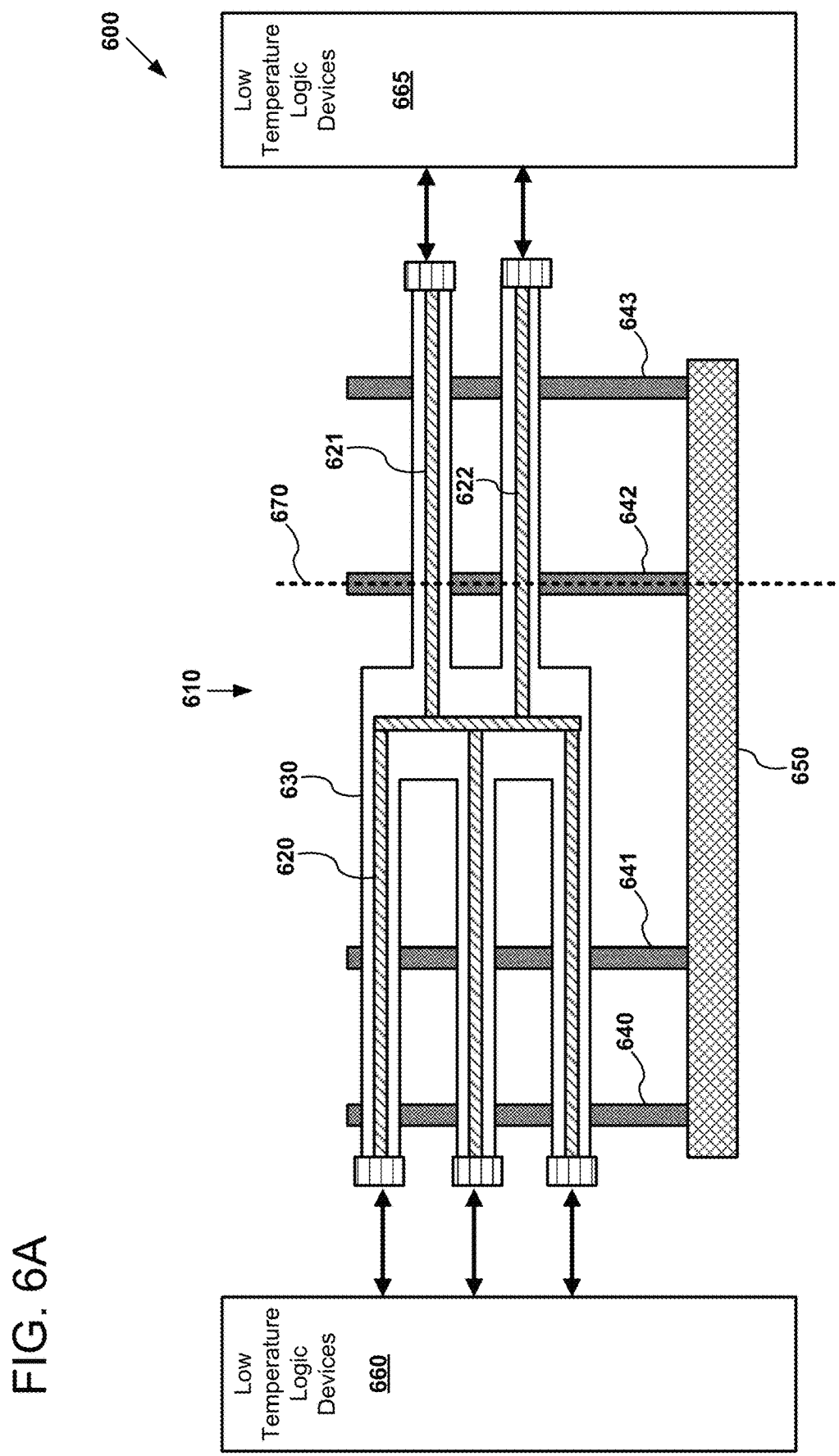

FIG. 6A is a diagram 600 illustrating an example system for cooling a multi-branch interconnect 610 using a thermally-conductive strap, as can be employed in alternate examples of the disclosed technology. In other examples, a heat pipe can be used instead of or in addition to the thermally-conductive strap.

As shown in FIG. 6A, one or more superconducting signal lines 620, 621, and 622 are disposed over and insulating substrate 630. The insulating substrate in turn is disposed over a planar layer of superconductor or conductor material on the obverse side of the interconnect 610 from the signal lines 620. A plurality of thermally-conductive straps, for example straps 640, 641, 642, and 643 are placed in thermal communication with the planar layer, for example, by being situated in contact with the planar layer. The distal ends of the strap(s) are coupled to a cool plate held at a low temperature. Heat from the interconnect 610 is transferred via the straps to the cool plate 650. In some examples, the thermally-conductive strap includes a conductor layer disposed on insulator portions of their interconnect coupling. In some examples, the conductor layer includes at least one of copper, and aluminum, silver, gold, or titanium. In some examples, insulator includes at least one of polyimide, Kapton, yttrium-stabilized zirconia (YSZ), Ceraflex, fluorinated ethylene propylene, Teflon, Mylar, or a ceramic material. In other examples, a heat pipe may be used in addition to, or instead of, the conductive straps.

FIG. 6B is a cross-sectional view 680 at the dashed line 670 of FIG. 6A of the multi-branch interconnect 610. As shown, the planar layer on the side opposite the signal lines 620 is placed in contact with a thermally-conductive strap 640. The distal end of the heat pipe is clamped in a cool plate 650. The cool plate 650 is configured to chill the thermally conductive strap to a temperature that is lower than the temperature at which the logic devices 660 and/or 665 are operating.

VIII. Example Performance of Superconductor Materials

Figure 7:
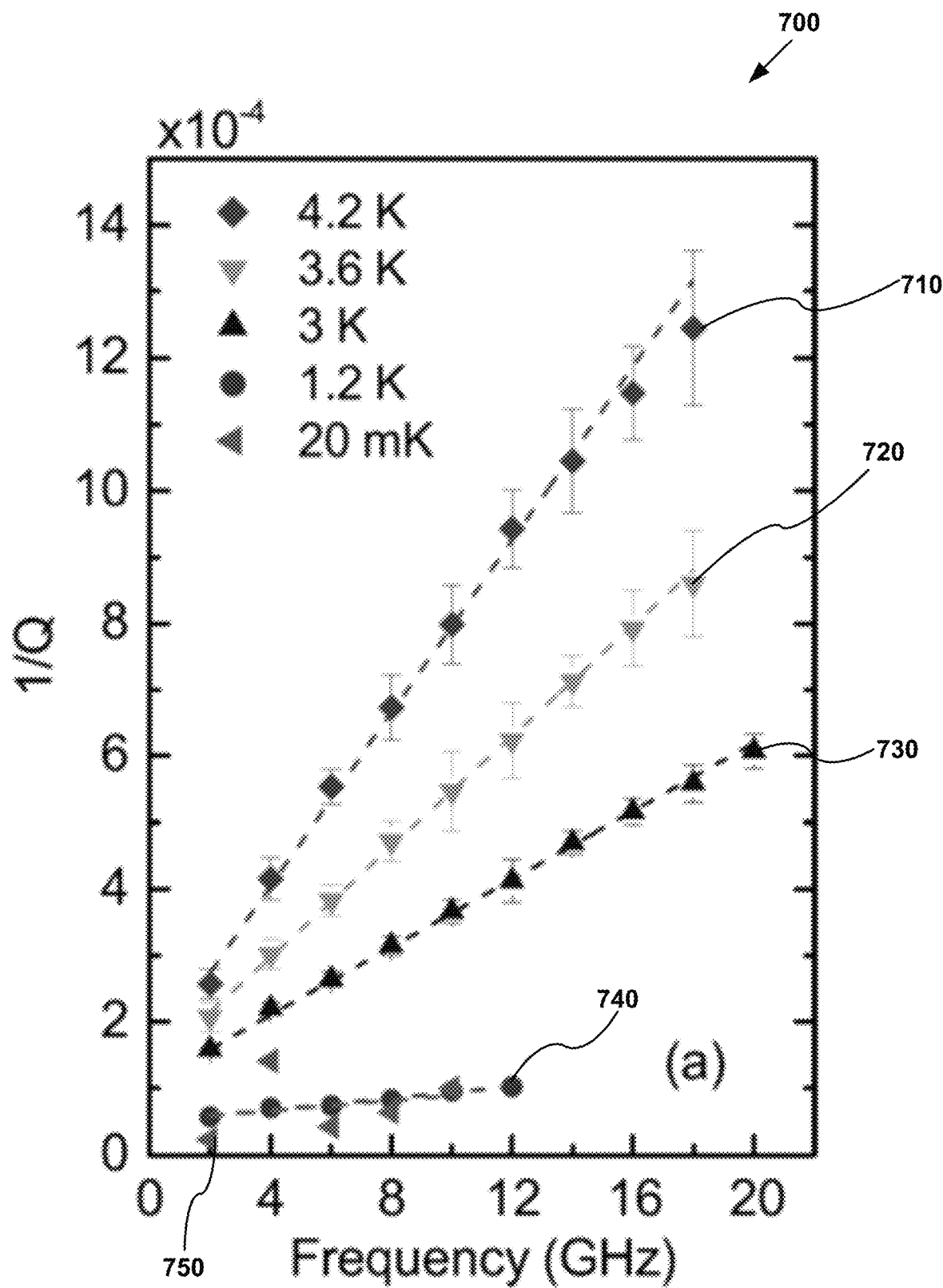
FIG. 7 is a chart showing the losses in a superconducting transmission line as a function of frequency and temperature, as can be observed in certain examples of the disclosed technology.

FIG. 7 is a chart 700 showing the losses in a superconducting transmission line as a function of frequency and temperature, as can be observed in certain examples of the disclosed technology. The losses were measured by configuring the transmission line as a resonator, where both ends of the line are open-circuited and weakly coupled to a network analyzer. For example, a first data series 710 shows losses for a superconducting transmission line at 4.2 K over a range of frequencies. A second and third series 720 and 730 show losses at 3.6 K and 3 K. A fourth and fifth series 740 and 750 show losses at 1.2 K and 20 mK. The quality factor ("Q") of the resonator was measured at each resonant frequency. The loss in the resonator is proportional to the reciprocal of Q (1/Q), and is plotted for several different temperatures. As shown in the chart 800, it is apparent that cooling below 4.2 K leads to dramatic reductions in loss, and that these reductions are more pronounced at higher frequencies.

IX. Example Method of Cooling Superconducting Interconnect

Figure 8:
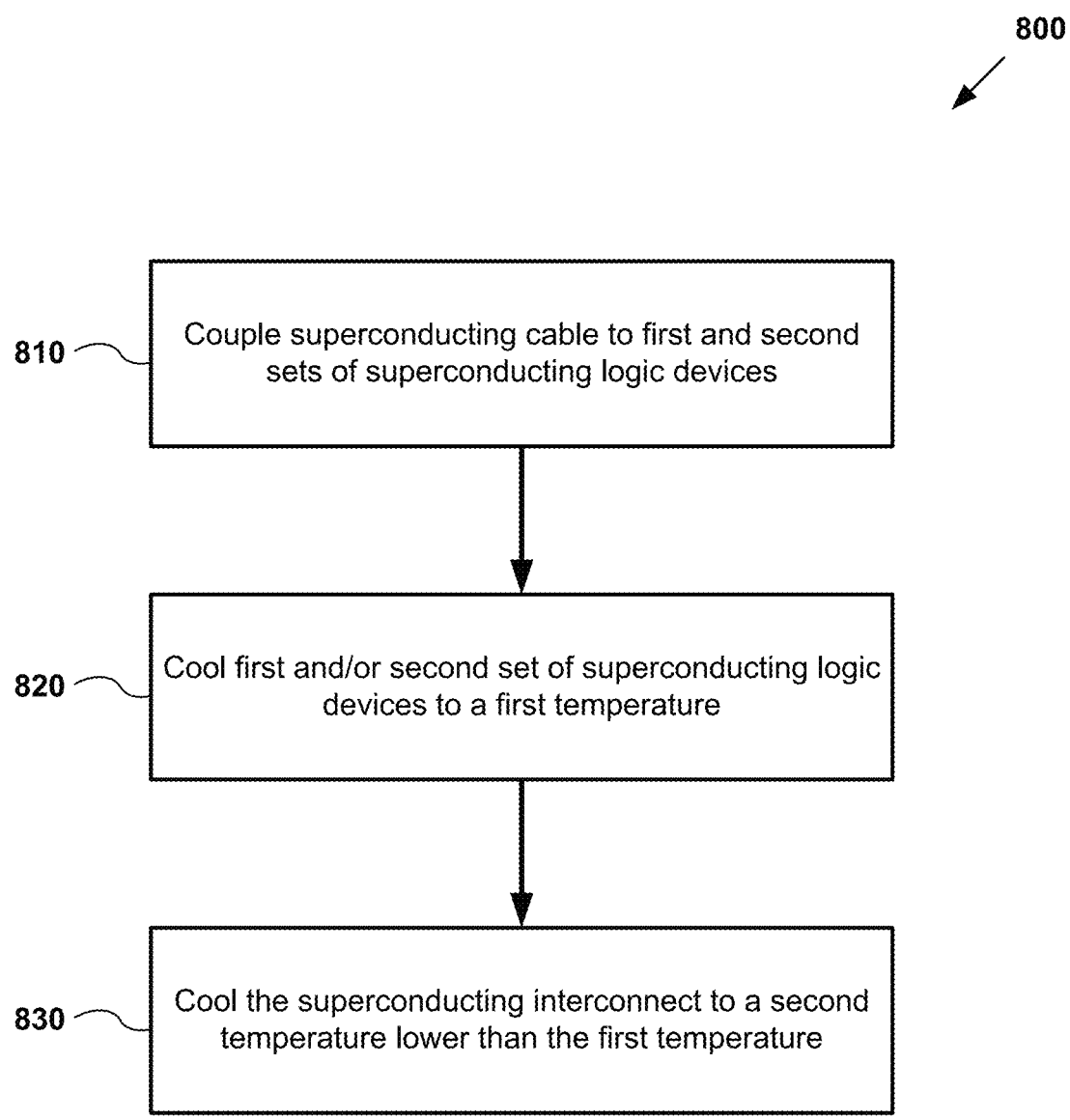
FIG. 8 is a flow chart outlining an example method of providing interconnection in a superconducting computer system, as can be performed in certain examples of the disclosed technology.

FIG. 8 is a flow chart 800 outlining an example method of providing interconnection in a superconducting computer system, as can be performed in certain examples of the disclosed technology. For example, the apparatus described above, including those having conduits configured to accept coolant, thermally-conductive straps, or heat pipes can be used to implement the illustrated method.

At process block 810, a superconducting interconnect such as a cable is coupled to first and second sets of superconducting logic devices. For example, flexible or rigid superconducting cables such as those discussed above can be coupled. In some examples, a polyamide cable including at least one superconductor stripline disposed on a surface is coupled to the superconducting logic devices using a clamp or other suitable connection technology. In some examples, conductor layers may also be disposed over at least a portion of the superconducting cables.

At process block 820, the first and/or second set of superconducting logic devices are cooled to a first temperature. For example, a cryostat or other refrigeration technology such as a dilution refrigerator can be used cooled the superconducting logic devices to a selected temperature.

At process block 830, the superconducting interconnect or cable coupled at process block 810 is cooled to a second temperature lower than the first temperature at which the superconducting lodge devices are cooled. For example, the superconducting logic devices can be cooled to about 4 K and the superconducting cable or interconnect can be cooled to be at or below to K. In some examples, the second temperature is at least 25% less than the first temperature, as measured in degrees Kelvin. In some examples, the superconducting cable is cooled by providing a radically sealed conduit, a thermally conductive strap, or a heat pipe and thermal communication with the superconducting cable.

X. Example Method of Cooling Interconnect with a Conduit

Figure 9:
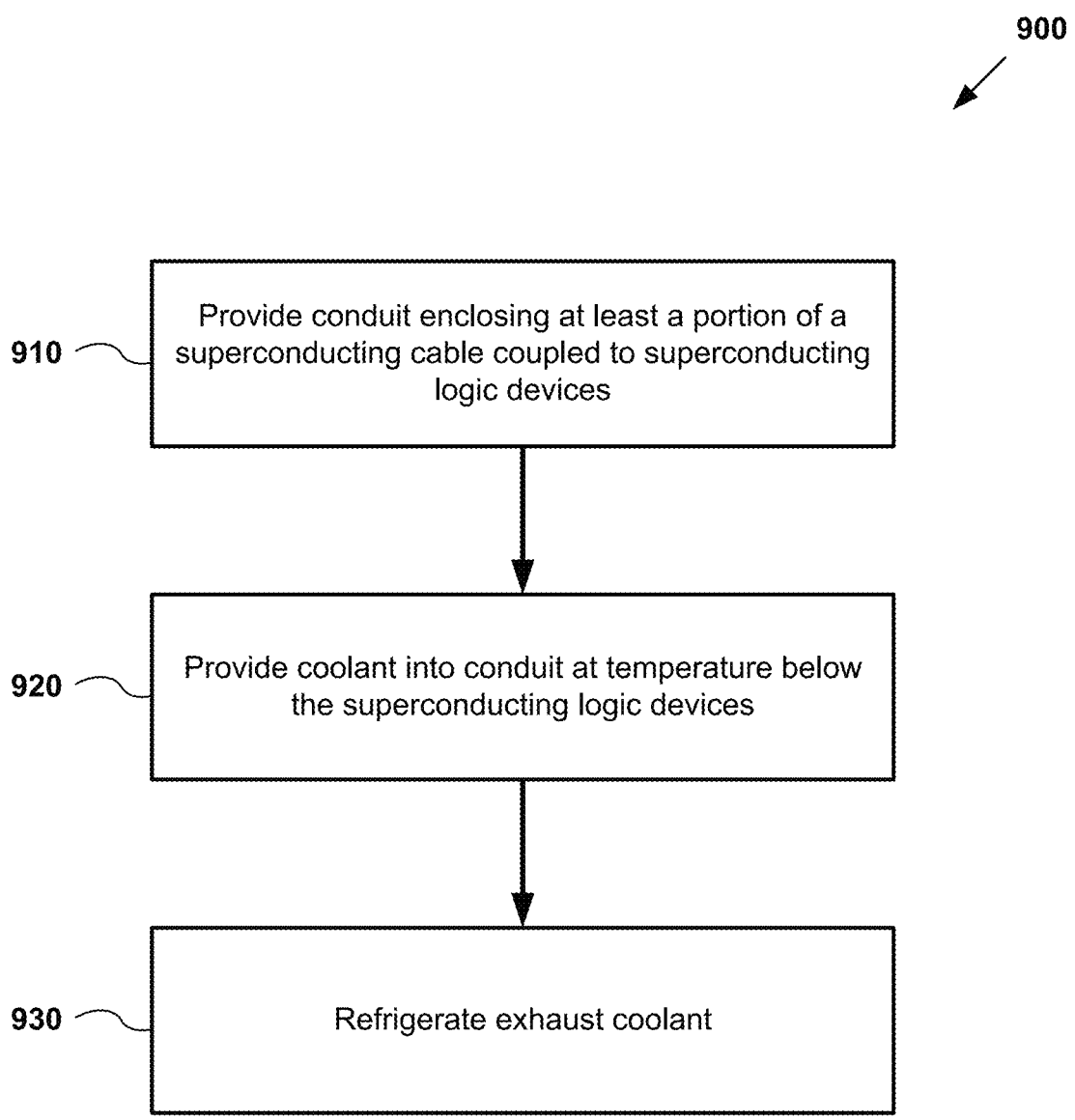
FIG. 9 is a flow chart outlining an example method of cooling a conduit coupled to superconducting lodge devices, as can be performed in certain examples of the disclosed technology.

FIG. 9 is a flow chart 900 outlining an example method of cooling a conduit coupled to superconducting lodge devices, as can be performed in certain examples of the disclosed technology. For example, the sealed conduits discussed above can be used to perform the illustrated method.

At process block 910, a conduit is provided enclosing at least a portion of the superconducting cable coupled to one or more sets of superconducting logic devices. The conduit can be airtight or hermetically sealed in order to enclose a coolant liquid or gas provided to the interior of the conduit. The conduit can have one or more inlet valves, for example inlet valves coupled to a Joule-Thomson valve and one or more outlet ports. Thus, the coolant can be cycled to a refrigerator to provide cooling of interconnect enclosed within the conduit.

At process block 920, coolant is provided into the conduit at a temperature below that of the superconducting lodge devices to which the interconnect is coupled. For example, helium vapor flow can be provided into the conduit via a Joule-Thomson valve. Further, helium vapor flow can be provided out of the conduit via an exhaust valve for further cooling. In some examples, liquid phase helium is provided to a conduit enclosing at least a portion of a superconducting interconnect. The coolant is provided at a lower temperature than at least one of the sets of superconducting logic devices. For example, the coolant can be provided at 2 K, 1 K, 100 mK, 20 mK, or other suitable temperature. Choice of temperature and coolant can be selected based on electrical properties of the enclosed interconnect. In some examples, it is desirable to select the coolant and properties such that attenuation of signals transmitted via the interconnect is kept to 20% or less or 10% or less.

At process block 930, exhaust coolant received via the conduit exhaust ports refrigerated to a temperature such that it can be reintroduced into the conduit.

XI. Additional Examples of the Disclosed Technology

Additional examples of the disclosed technology are disclosed in accordance with the examples above.

In some examples of the disclosed technology, a method of providing interconnection in a superconducting computing system includes coupling a superconducting cable to a first set of superconducting logic based devices and a second set of superconducting logic based devices, cooling the first set, the second set, or the first set and the second set of superconducting logic based devices to a first temperature, and cooling the superconducting cable to a second temperature lower than the first temperature. In some examples, the first temperature is about 4 degrees Kelvin (K) and the second temperature is at or below 2 degrees Kelvin. In some examples, the first temperature is about 4.2 degrees Kelvin (K) and the second temperature is at or below 3 degrees Kelvin. In some examples, the first temperature is about 3.6 degrees Kelvin (K) and the second temperature is at or below 1.2 degrees Kelvin. In some examples, the first temperature is about 4 degrees Kelvin (K) and the second temperature is at or below 20 degrees milliKelvin. In some examples, the first temperature is below a temperature selected from the group consisting of 4.2, 4.0, 3.6, 3.0, 2.4, 2.0, or 1.2 degrees Kelvin, and the second temperature is a temperature below the first temperature, the second temperature being selected from the group consisting of 4.0, 3.6, 3.0, 2.4, 2.0, or 1.2 degrees Kelvin. In some examples, the second temperature is at least 25% less than the first temperature in degrees Kelvin. In some examples, the second temperature is at least 50% less than the first temperature in degrees Kelvin. In some examples, the second temperature is at least 75% less than the first temperature in degrees Kelvin.

In some examples, the method further includes providing a hermetically sealed conduit enclosing at least a portion of the superconducting cable and providing helium vapor flow into the conduit via a Joule-Thomson valve. In some examples, the method further includes providing helium vapor flow out of the conduit via an exhaust valve. In some examples, liquid helium is provided to cool the superconducting cable. In some examples, a gas having a higher boiling point is provided into the conduit, depending on the properties of the superconductor used in the interconnect. In some examples, the method further includes refrigerating at least a portion of the helium vapor flow out of the conduit and providing the refrigerated vapor into the conduit via the Joule-Thomson valve. In some examples, the method further includes providing a heat pipe or a thermally-conductive strap in thermal communication with the superconducting cable in addition to, or instead of, providing a cooling vapor or liquid to the superconducting interconnect.

In some examples, the superconducting cable includes at least one superconducting signal line and at least one conductor plane, and the cooling the superconducting cable comprises providing at least one cold plate in thermal communication with the at least one conductor plane. In some examples, the cooling the superconducting cable includes providing liquid or gas phase helium to a hermetically sealed manifold enclosing at least a portion of the superconducting cable. In some examples, the two sets of superconducting logic devices are situated on two different substrates. In some examples, the two sets of superconducting logic devices are situated within two separate enclosures. In some examples, the two sets of superconducting logic devices are cooled by the same cryogenic cooler, while in others, separate coolers are used.

In some examples, of the method, a heat pipe or a thermally-conductive strap is provided in addition to, or instead of, a valve providing cooled liquid helium or gaseous helium. The heat pipe or thermally-conductive strap provides thermal communication between the cooling apparatus and the at least one interconnect. In some examples, the heat pipe or thermally-conductive strap includes a conductor layer disposed on insulator portions of the interconnect coupling. In some examples, the conductor layer is a metal. In some examples, the conductor layer includes at least one of copper, aluminum, silver, gold, or titanium. In some examples, the insulator includes at least one of polyimide, Kapton, yttrium-stabilized zirconia (YSZ), Ceraflex, fluorinated ethylene propylene, Teflon, Mylar, or a ceramic material. In some examples, the superconducting interconnect coupling comprises at least one signal line comprising at least one of niobium, molybdenum nitride, or niobium titanium nitride.

In some examples of the disclosed technology, an apparatus includes a sealable conduit that is adapted to enclose at least a portion of a superconducting interconnect, the conduit being further adapted receive a liquid or gas coolant to chill the superconducting interconnect, the conduit being further adapted to couple the superconducting interconnect to one or more superconducting logic devices. In some examples, the apparatus includes at least one Joule-Thomson valve coupled to the conduit and being adapted to provide a gas coolant to an interior portion of the conduit. In some examples, the apparatus includes an exhaust port coupled to the conduit and being adapted to receive the gas coolant from the interior portion of the conduit. In some examples, the apparatus is adapted to receive helium gas or liquid as the coolant. In some examples, the first temperature is about 4 degrees Kelvin (K) and the second temperature is at or below 2 degrees Kelvin. In some examples, the first temperature is about 4.2 degrees Kelvin (K) and the second temperature is at or below 3 degrees Kelvin. In some examples, the first temperature is about 3.6 degrees Kelvin (K) and the second temperature is at or below 1.2 degrees Kelvin. In some examples, the first temperature is about 4 degrees Kelvin (K) and the second temperature is at or below 20 degrees milliKelvin. In some examples, the first temperature is below a temperature selected from the group consisting of 4.2, 4.0, 3.6, 3.0, 2.4, 2.0, or 1.2 degrees Kelvin, and the second temperature is a temperature below the first temperature, the second temperature being selected from the group consisting of 4.0, 3.6, 3.0, 2.4, 2.0, or 1.2 degrees Kelvin. In some examples, the second temperature is at least 25% less than the first temperature in degrees Kelvin. In some examples, the second temperature is at least 50% less than the first temperature in degrees Kelvin. In some examples, the second temperature is at least 75% less than the first temperature in degrees Kelvin. In some examples, a gas having a higher boiling point than Helium is provided into the conduit, depending on the properties of the superconductor used in the interconnect.

In some examples, the apparatus includes the superconducting interconnect, which includes at least one signal line comprising superconductor material disposed over an insulator. In some examples, the apparatus further includes at least one valve coupled to the conduit and being adapted to provide a liquid coolant to an interior portion of the conduit and an exhaust port coupled to the conduit and being adapted to receive the liquid coolant in a gaseous or liquid form. In some examples, the exhaust port is coupled to a cryogenic cooler than can re-chill the coolant and recirculate back to the apparatus valve. In some examples, the superconducting interconnect includes a polyimide cable including at least one superconductor stripline disposed on a surface of the cable, the polyimide cable forming a portion of the superconducting interconnect. In some examples, the apparatus further includes a valve coupled to the conduit and being adapted to accept a gas coolant provided at a first temperature and a first pressure, the valve being further adapted to provide the gas coolant to an interior portion of the conduit at a lower pressure than the first pressure and at a second temperature lower than the first temperature. In some examples, the apparatus is adapted to receive helium gas or liquid as the coolant. In some examples, the first temperature is about 4 degrees Kelvin (K) and the second temperature is at or below 2 degrees Kelvin. In some examples, the first temperature is about 4.2 degrees Kelvin (K) and the second temperature is at or below 3 degrees Kelvin. In some examples, the first temperature is about 3.6 degrees Kelvin (K) and the second temperature is at or below 1.2 degrees Kelvin. In some examples, the first temperature is about 4 degrees Kelvin (K) and the second temperature is at or below 20 degrees milliKelvin. In some examples, the first temperature is below a temperature selected from the group consisting of 4.2, 4.0, 3.6, 3.0, 2.4, 2.0, or 1.2 degrees Kelvin, and the second temperature is a temperature below the first temperature, the second temperature being selected from the group consisting of 4.0, 3.6, 3.0, 2.4, 2.0, or 1.2 degrees Kelvin. In some examples, the second temperature is at least 25% less than the first temperature in degrees Kelvin. In some examples, the second temperature is at least 50% less than the first temperature in degrees Kelvin. In some examples, the second temperature is at least 75% less than the first temperature in degrees Kelvin. In some examples, a gas having a higher boiling point than Helium is provided into the conduit, depending on the properties of the superconductor used in the interconnect. In some examples, the apparatus includes a heat pipe or a thermally-conductive strap in addition to, or instead of, a valve providing cooled liquid helium or gaseous helium. The heat pipe or thermally-conductive strap provides thermal communication between the cooling apparatus and the at least one interconnect. In some examples, the heat pipe or thermally-conductive strap includes a conductor layer disposed on insulator portions of the interconnect coupling. In some examples, the conductor layer is a metal. In some examples, the conductor layer includes at least one of copper, aluminum, silver, gold, or titanium. In some examples, the insulator includes at least one of polyimide, Kapton, yttrium-stabilized zirconia (YSZ), Ceraflex, fluorinated ethylene propylene, Teflon, Mylar, or a ceramic material. In some examples, the interconnect coupling comprises at least one signal line comprising at least one of niobium, molybdenum nitride, or niobium titanium nitride.

In some examples of the disclosed technology, a system includes at least two sets of superconducting logic devices, cooling apparatus adapted to cool the at least two sets of superconducting logic devices at or below a first operating temperature, at least one interconnect coupling the at least two sets of superconducting logic devices and including at least one superconducting signal line, and cooling apparatus in thermal communication with the at least one interconnect, the cooling apparatus being adapted to cool the at least one superconducting signal line to a second, lower operating temperature than the first operating temperature of the at least two sets of superconducting logic devices. In some examples, the system includes a heat pipe or a thermally-conductive strap in addition to, or instead of, a valve providing cooled liquid helium or gaseous helium. The heat pipe or thermally-conductive strap provides thermal communication between the cooling apparatus and the at least one interconnect. In some examples, the heat pipe or thermally-conductive strap includes a conductor layer disposed on insulator portions of the interconnect coupling. In some examples, the conductor layer is a metal. In some examples, the conductor layer includes at least one of copper, aluminum, silver, gold, or titanium. In some examples, the insulator includes at least one of polyimide, Kapton, yttrium-stabilized zirconia (YSZ), Ceraflex, fluorinated ethylene propylene, Teflon, Mylar, or a ceramic material. In some examples, the interconnect coupling comprises at least one signal line comprising at least one of niobium, molybdenum nitride, or niobium titanium nitride. In some examples, the system further includes a hermetically-sealed conduit enclosing at least a portion of the at least one interconnect, the conduit being further configured to accept coolant provided at a temperature lower than the first operating temperature.

In view of the many possible embodiments to which the principles of the disclosed subject matter may be applied, it should be recognized that the illustrated embodiments are only preferred examples of the disclosed technology and should not be taken as limiting the scope of the claimed subject matter. Rather, the scope of the invention is defined by the following claims. We therefore claim as our invention all that comes within the scope these claims.

What is claimed is:

1. An apparatus, comprising:
a sealable conduit adapted to enclose at least a portion of a superconducting interconnect, the conduit being further adapted receive a liquid or gas coolant to chill the superconducting interconnect, the conduit being further adapted to couple the superconducting interconnect to one or more superconducting logic devices.

2. The apparatus of claim 1, further comprising:
a Joule-Thomson valve coupled to the conduit and being adapted to provide a gas coolant to an interior portion of the conduit; and
an exhaust port coupled to the conduit and being adapted to receive the gas coolant from the interior portion of the conduit.

3. The apparatus of claim 1, further comprising:
an exhaust port coupled to the conduit and being adapted to receive the gas coolant from the interior portion of the conduit.

4. The apparatus of claim 1, further comprising:
the superconducting interconnect, the interconnect comprising at least one signal line comprising superconductor material disposed over an insulator.

5. The apparatus of claim 1, further comprising:
a polyimide cable comprising at least one superconductor stripline disposed on a surface of the cable, the polyimide cable forming a portion of the superconducting interconnect.

6. The apparatus of claim 1, further comprising:
a valve coupled to the conduit and being adapted to accept a gas coolant provided at a first temperature and a first pressure, the valve being further adapted to provide the gas coolant to an interior portion of the conduit at a lower pressure than the first pressure and at a second temperature lower than the first temperature.

7. The apparatus of claim 1, further comprising:
a first cooling apparatus adapted to cool the superconducting logic devices to a first temperature range;
the superconducting interconnect; and
a second cooling apparatus adapted to cool the superconducting interconnect to a second temperature below the first temperature range.

8. The apparatus of claim 1, further comprising:
a heat pipe or thermally conductive strap comprising a conductor layer disposed on insulator portions of the superconducting interconnect.

9. The apparatus of claim 1, wherein:
the superconducting interconnect comprises at least two branches; and
the conduit encloses two or more branches of the superconducting interconnect.

10. The apparatus of claim 4, wherein:
the insulator comprises at least one of polyimide, Kapton, yttrium-stabilized zirconia (YSZ), Ceraflex, fluorinated ethylene propylene, Teflon, Mylar, or a ceramic material; and
the signal line comprises at least one of niobium, molybdenum nitride, or niobium titanium nitride.

11. A method comprising:
enclosing a superconducting interconnect coupled to superconducting logic devices with a sealable conduit adapted to receive a liquid or gas coolant; and
with the sealable conduit, cooling the superconducting interconnect to a first temperature lower than a second temperature of the superconducting logic devices.

12. The method of claim 11, wherein the first temperature is at or below 2 degrees Kelvin (K) and the second temperature is at or above 4 degrees Kelvin.

13. The method of claim 11, wherein the first temperature is at least 25% less than the second temperature in degrees Kelvin.

14. The method of claim 11, wherein the cooling comprises providing helium vapor flow into the conduit via a Joule-Thomson valve.

15. (Withdrawn The method of claim 11, wherein the cooling comprises providing liquid or gas phase helium to a hermetically sealed manifold enclosing at least a portion of the superconducting interconnect.

16. The method of claim 11, wherein the cooling comprises providing helium vapor flow out of the conduit via an exhaust valve.

17. The method of claim 11, wherein the cooling comprises refrigerating at least a portion of helium vapor flow out of the conduit and providing the refrigerated vapor into the conduit via a Joule-Thomson valve.

* * * * *